United States Patent
Cho et al.

(10) Patent No.: US 7,572,339 B2
(45) Date of Patent: Aug. 11, 2009

(54) SURFACE TREATMENT SYSTEM AND METHOD THEREOF

(75) Inventors: Cheon-Soo Cho, Gyeongsangnam-Do (KR); Dong-Sik Youn, Gyeongsangnam-Do (KR); Hyun-Wook Lee, Gyeongsangnam-Do (KR); Samchul Ha, Gyeongsangnam-Do (KR); Hyun-Woo Jun, Gyeongsangnam-Do (KR)

(73) Assignee: LG Electronics Inc., Seoul (KR)

( * ) Notice: Subject to any disclaimer, the term of this patent is extended or adjusted under 35 U.S.C. 154(b) by 425 days.

(21) Appl. No.: 10/486,031

(22) PCT Filed: Dec. 28, 2002

(86) PCT No.: PCT/KR02/02472

§ 371 (c)(1),
(2), (4) Date: Aug. 5, 2004

(87) PCT Pub. No.: WO03/083163

PCT Pub. Date: Oct. 9, 2003

(65) Prior Publication Data

US 2004/0244690 A1    Dec. 9, 2004

(30) Foreign Application Priority Data

Mar. 29, 2002   (KR)   ............... 10-2002-0017510

(51) Int. Cl.
*C23C 16/00* (2006.01)

(52) U.S. Cl. .................................... 118/729

(58) Field of Classification Search ............... 118/728, 118/729
See application file for complete search history.

(56) References Cited

U.S. PATENT DOCUMENTS

| 4,501,766 | A | | 2/1985 | Suzuki et al. |
| 4,556,471 | A | | 12/1985 | Bergman et al. |
| 5,079,031 | A | * | 1/1992 | Yamazaki et al. ........... 427/570 |
| 5,244,559 | A | * | 9/1993 | Latz ...................... 204/298.09 |
| 5,372,648 | A | * | 12/1994 | Yamamoto et al. ....... 118/723 E |
| 6,017,396 | A | * | 1/2000 | Okamoto .................... 118/719 |

FOREIGN PATENT DOCUMENTS

WO    WO-99/27157 A1    6/1999

* cited by examiner

*Primary Examiner*—Parviz Hassanzadeh
*Assistant Examiner*—Maureen Gramaglia
(74) *Attorney, Agent, or Firm*—Birch, Stewart, Kolasch & Birch, LLP

(57) ABSTRACT

Disclosed are a surface treatment system that includes a deposition chamber (100) for forming a deposition layer at a surface of an object of surface treatment (900); a carrier (910) for carrying the object of surface treatment (900) by mounting thereon, and a power applying unit (230) for forming a deposition reaction by applying a power to the object in the deposition chamber (100), wherein the power applying unit (230) includes a fixed power applying unit (220) installed in the deposition chamber (100) and connected to an external power source (210); and a movable power applying unit (230) installed at the carrier (910) for being electrically connected to the fixed power applying unit (220) movably as the carrier on which the object of surface treatment (900) is mounted goes into the deposition chamber and thereby applying a power to the object of surface treatment mounted on the carrier by contacting thereto.

15 Claims, 3 Drawing Sheets

SURFACE TREATMENT SYSTEM AND METHOD THEREOF

TECHNICAL FIELD

The present invention relates to a surface treatment system that forms deposition layer at a surface of a product and a method thereof, and more particularly, to a power supply to an object of surface treatment for the surface treatment system that is formed with the deposition layer.

BACKGROUND ART

In general, a surface treatment is to make a surface of a product made of a material such as a metal look good, or to improve a surface to have heat resistance, corrosion resistance, abrasion resistance, etc. so that a function of the product can be improved according to a condition of usage of the product. That is, the surface treatment is concealing inner defects, etc. by properly treating a surface of the metal.

The surface treatment includes plating on a surface of an accessory, chromium plating on brass, or a tinplating for iron sheet, etc.

The surface treatment methods include alumite for protecting an inside of an object of surface treatment by making oxide film, an anticorrosive coating by paint, a chemical vapor deposition (CVD) reaction, or a physical vapor deposition (PVD) reaction.

In the meantime, a heat exchanger used in an air conditioner, a refrigerator, a heating apparatus, etc. is a device for transferring heat from fluid of high temperature to fluid of low temperature through a heat transfer wall. At this time, a flow of the fluid becomes different according to a characteristic of a surface of the heat transfer wall, and the characteristic of the surface of the heat transfer wall greatly influences to a heat exchange efficiency of the heat exchanger.

Accordingly, a radiator surface of the heat exchanger is required to have a surface treatment having various characteristics according to a performance of the heat exchanger. To this end, fins of the heat exchanger are fabricated by processing a sheet having a treated surface to improve hydrophilicity, hydrophobicity, or corrosion resistance.

Also, the sheet for processing the fins of the exchanger has a surface treatment that forms a deposition layer at the surface of the sheet by using the chemical vapor deposition reaction or the physical vapor deposition reaction.

In the meantime, for the surface treatment, reaction gas is injected in a deposition chamber and then power is applied thereto for a deposition reaction. A method for applying power includes a method for applying power to the object of surface treatment for the deposition reaction.

In the conventional surface treatment method represented in PCT Publication No. WO9927157, power is directly applied to an object of surface treatment in a polymerization chamber injected by reaction gas to cause a plasma polymerization reaction, thereby forming a deposition layer at a surface of the object of surface treatment.

However, in said method, a deposition reaction in the deposition chamber, a formation of a deposition layer, and a characteristic of the formed deposition layer are greatly influenced by the method for applying power to the object of surface treatment.

Especially in case that the object of surface treatment is treated with a large number of quantity, a power has to be properly applied to the object of surface treatment without influencing to the deposition reaction or the deposition layer formed at the surface.

In the meantime, a product requiring the surface treatment is processed according to condition or shape and then fabricated after the surface treatment. At the time of said processing, a cut surface or the deposition layer can be damaged and another member having no surface treatment can be generated.

That is, when the objects of which surfaces are treated with a large number of quantities in order to have required characteristics processed by molding or assembling, the surfaces can be damaged. Also, other members without required characteristics can reduce effects of the surface treatment.

DISCLOSURE OF THE INVENTION

Therefore, it is an object of the present invention to provide a surface treatment system that performs a deposition reaction in a deposition chamber by applying power to an object of surface treatment mounted on a carrier to form a deposition layer and a method thereof.

To achieve these objects, there is provided a surface treatment system comprising: a deposition chamber; a carrier for mounting and carrying an object of surface treatment; and a power applying unit for forming a deposition reaction by applying a power to the object in the deposition chamber in order to form a deposition layer at a surface of the object of surface treatment, wherein the power applying unit includes a fixed power applying unit installed in the deposition chamber and connected to external power source; and a movable power applying unit installed at the carrier for being electrically connected to the fixed power applying unit movably as the carrier on which the object of surface treatment is mounted goes into the deposition chamber and thereby applying a power to the object of surface treatment mounted on the carrier by contacting thereto.

To achieve these objects, there is also provided a surface treatment system comprising: a deposition chamber, a carrier for mounting and carrying an object of surface treatment, and a power applying unit for forming a deposition reaction by applying a power to the object in the deposition chamber in order to form a deposition layer at a surface of the object of surface treatment, wherein the power applying unit includes a fixed power applying unit installed in the deposition chamber and connected to an external power source; and a sliding contact means for electrically connecting the fixed power applying unit and the object of the surface treatment mounted on the carrier movably at the time of a deposition reaction.

MODES FOR CARRYING OUT THE PREFERRED EMBODIMENTS

Hereinafter, the surface treatment system according to the present invention and a surface treatment method will be explained with reference to the attached drawings.

Figure 1:
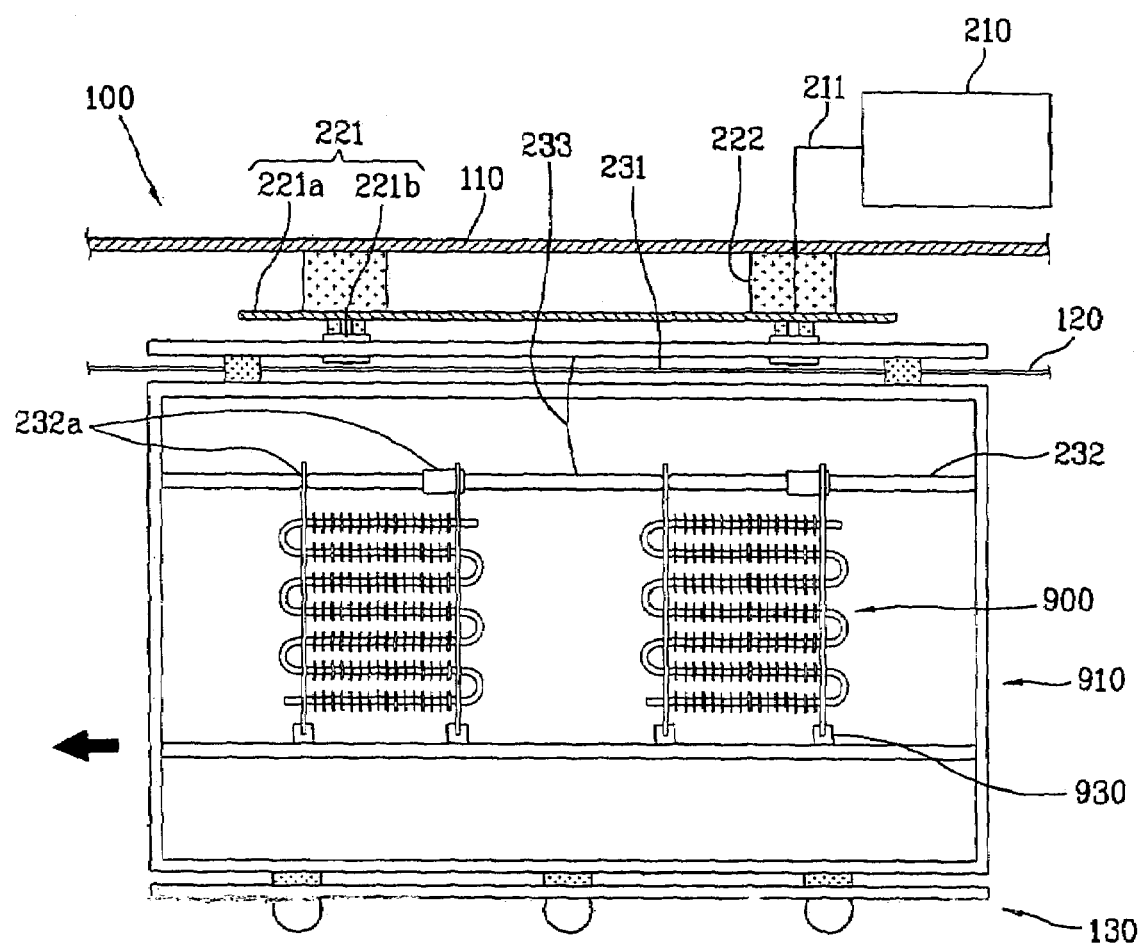
FIG. 1 is a longitudinal sectional view showing a surface treatment system according to the present invention.
Figure 2:
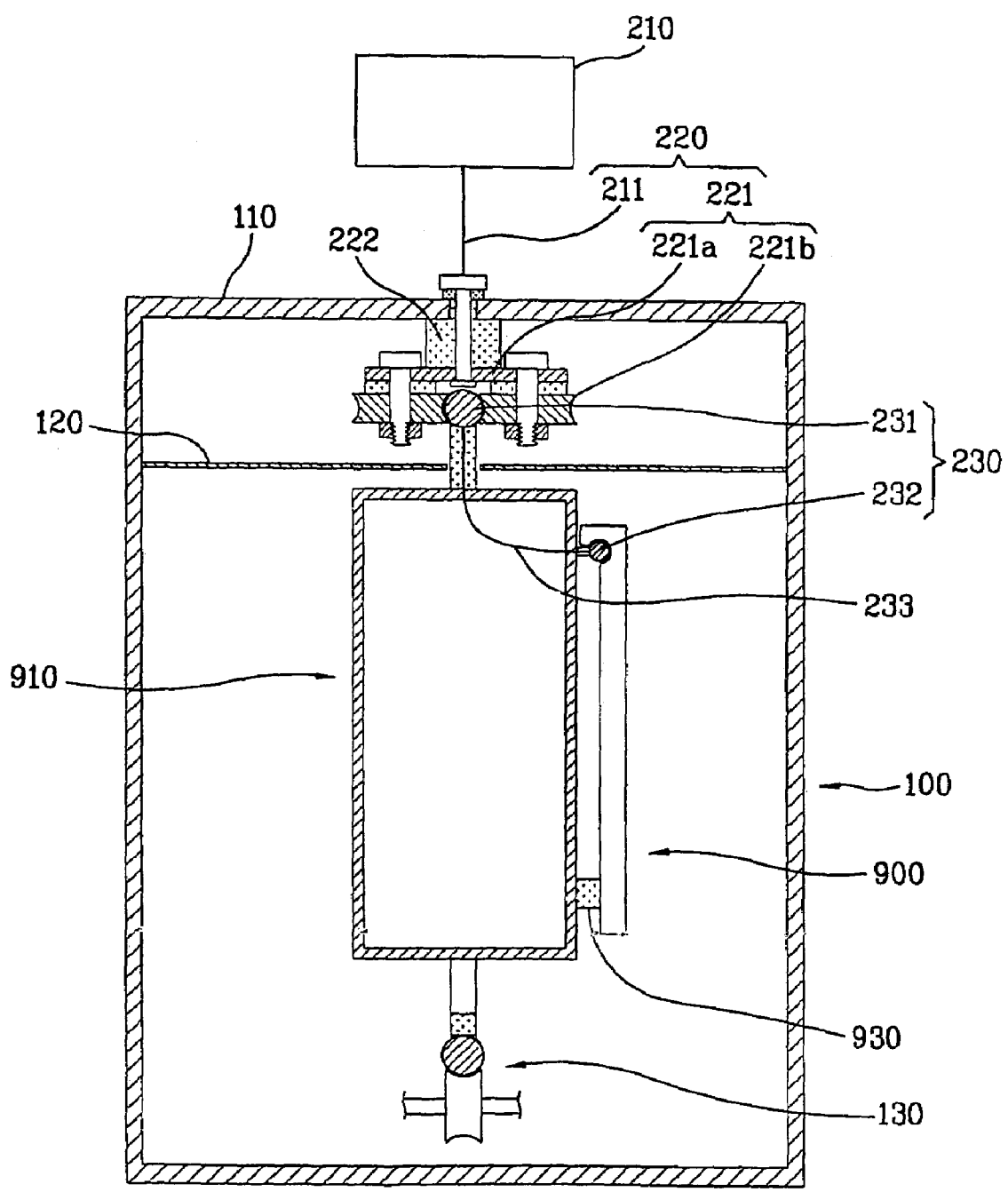
FIG. 2 is a lateral sectional view of FIG. 1.

FIG. 1 is a longitudinal sectional view showing a surface treatment system according to the present invention, and FIG. 2 is a lateral sectional view of FIG. 1.

As shown in FIGS. 1 and 2, the surface treatment system according to the present invention comprises: a deposition chamber 100, a carrier 910 for mounting and carrying an object of surface treatment 900, and a power applying unit for a deposition reaction by applying a power to the object 900 in the deposition chamber 100 in order to form a deposition layer at a surface of the object of surface treatment 900.

The deposition chamber forms a deposition layer at the surface by using a chemical vapor deposition (CVD) reaction or a physical vapor deposition (PVD) reaction. Herein, necessary units for the deposition reaction except the power applying unit include a reaction gas inlet and a reaction gas outlet, which are not shown in drawings for simplicity purpose.

The carrier 910 mounts and carries the object of surface treatment 900 with a transferring device 130. At first, the carrier 910 mounts the object of surface treatment 900 and transfers to the deposition chamber 100, so that a deposition layer is formed on the surface of the object of surface treatment 900 by a deposition reaction. Then, the carrier 910 transfers the object of surface treatment 900 out of the deposition chamber 100.

Especially, the carrier 910 is arranged consecutively and sequentially, so that the surface treatment system can perform the surface treatment sequentially.

The power applying unit includes a fixed power applying unit 220 installed in the deposition chamber 100 and connected to an external power source 210; and a movable power applying unit 230 installed at the carrier 910 for being movably contacted with the fixed power applying unit 210 to be electrically connected thereto as the carrier 910 on which the object of surface treatment 900 is mounted enters the deposition chamber 100 for a deposition reaction and thereby applying power to the object of surface treatment 900 by contacting to the object 900.

The fixed power applying unit 220 is insulatedly installed on an inner wall 110 of the deposition chamber 100 by an insulating member 222. Even though the fixed power applying unit 220 is preferably installed at the upper side or the lower side of the deposition chamber 100, the location can be varied according to the deposition chamber 100.

The fixed power applying unit 220 includes a power applying line 211 inserted into the deposition chamber 100 from the external power source 210 and a conducting member 221 connected to the power applying line 211 and contacted to the movable power applying unit 230.

As shown in FIG. 2, the conducting member 221 includes a first conducting member 221a connected with the power applying line 211 and installed at the upper wall 110 of the deposition chamber 100 by the insulating member 222 in insulated state with the inner wall of the deposition chamber 100, and a second conducting member 221b electrically connected to the first conducting member 221a and contacted with the movable power applying unit 230.

As shown in FIG. 2, the first conducting member 221a is a conductive rod arranged in a progressive direction of the carrier 910 at the upper side of the deposition chamber 100.

As shown in FIG. 2, the second conducting member 221b is electrically connected to the first conducting member 221a by being fixed thereto, and contacted to a contacting member 231 of the movable power applying unit 230 of the carrier 910 which will be later explained.

In the meantime, the movable power applying unit 230 includes the contacting member 231 installed at the carrier 910 and contacted with the first conducting member 221a, and a mounting member 232 installed at the carrier 910 and electrically connected to the contacting member 231 for applying power to the object of surface treatment 900.

The contacting member 231 includes the second conducting member 221b as a pair of rollers, and includes a rod such as a round bar installed to the carrier 910 toward the transferred direction and inserted between the pair of rollers. Thereby, the contacting member 231 is electrically connected with the external power source 210.

In the meantime, the fixed power applying unit 220 and the contacting member 231 influences to a deposition reaction. As shown in FIGS. 1 and 2, a shielding member 120 of insulating material can be additionally installed at a contact portion between the fixed power applying unit 220 and the movable power applying unit 230 in the deposition chamber 100.

The mounting member 232 includes a fixed bar electrically connected with the contacting member 231 by a power connecting line 233 which is covered with insulating material.

The carrier 910 is provided with a location fixing device for fixing a location of the object of surface treatment 900. The location fixing device includes a hooking portion 232a formed at the mounting member 232 so that the object of surface treatment 900 can be the hooked to the mounting member 232.

The location fixing device simultaneously plays a role of a mounting device for mounting the object of surface treatment 900 to the carrier 910.

Also, the location fixing means additionally includes a corresponding hooking portion 920 formed at the object of surface treatment 900 so that the object of surface treatment 910 can be hooked at the hooking portion 230a, which is preferable in surface-treating the object 900 consecutively with a large amount of quantities.

Figure 3:
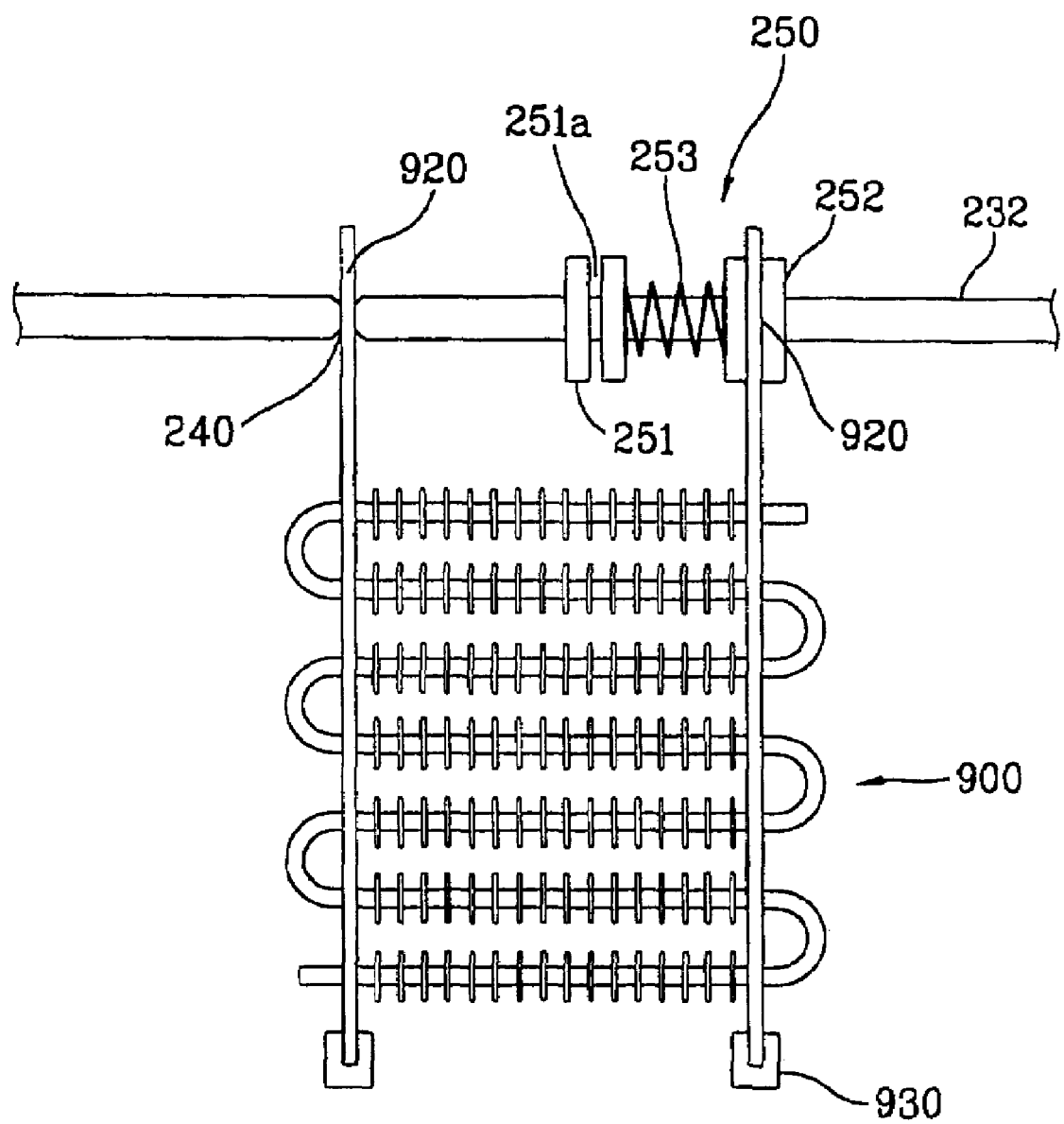
FIG. 3 is a perspective view showing a location fixing means of the surface treatment system of FIG. 1.

FIG. 3 is a perspective view showing a location fixing means of the surface treatment system of FIG. 1.

As shown in FIG. 3, the location fixing means includes an annular groove 240 formed at one side of the fixed bar 232, and a slidable stopper 250 installed with a predetermined interval from the groove along the longitudinal direction of the fixed bar 232 as a width of the corresponding hooking portion 920 of the object of surface treatment 900.

The stopper 250 includes a first stopper 251 installed at the fixed bar 232 with a predetermined interval from the groove 240, and a second stopper 252 slidably installed at the fixed bar 232.

Also, an elastic means 252 for fixing the object of surface treatment 900 can be additionally installed between the first and second stoppers 251 and 252.

It is preferable that the first and second stoppers 251 and 252 respectively include annular grooves 251a and 252a for hooking the corresponding hooking portions 920 of the object of surface treatment 900.

Also, insulation supporting members 930 for supporting the object of surface treatment 900 hooked at the hooking portion 232a in electrically insulated state can be additionally installed at the carrier 910, thereby preventing electricity from being connected to the carrier 900 or the deposition chamber 100.

Operations of the surface treatment system according to the present invention will be explained.

First, the object of surface treatment 900 is transferred by being mounted on the mounting member 232 installed at the carrier 910.

The object of surface treatment 900 is transferred into the deposition chamber 100 to form a deposition layer at the surface of the object of surface treatment 900. When the carrier 910 goes into the deposition chamber 100, the contacting member 231 of the movable power applying unit 230 installed at the carrier 910 also goes into the deposition chamber 100, thereby movably contacting with the second conducting member 221b of the fixed power applying unit 220, that is, starting to a sliding contact.

The object of surface treatment 900 transferred by the sliding contact between the fixed power applying unit 220 and the movable power applying unit 230 is electrically connected with the external power 210. After the carrier 910 goes into the deposition chamber 100 completely, the deposition chamber 100 is closed and sealed by an open/close door (not shown) and sealing device (not shown).

Subsequently, power is applied by the power applying unit from the external power source 210 by a control unit (not shown), thereby applying the power to the object of surface treatment 900. In the deposition chamber 100, a deposition reaction is generated as the power is applied, thereby forming a deposition layer at the surface of the object of surface treatment 900.

When the deposition layer is formed at the surface of the object of surface treatment 900 by the deposition reaction, the carrier 910 transfers the object of surface treatment 900 out of the deposition chamber 100.

Especially, in the present invention, a plurality of carriers are used, so that another carrier mounted with another object of surface treatment goes into the deposition chamber consecutively and sequentially, forms a deposition layer, and is transferred out. As said process is repeated, the object of surface treatment can be consecutively surface-treated with a large number of quantities.

The present invention provides the surface treatment system which forms a deposition layer with a deposition reaction by applying power to the object of surface treatment by a sliding contact, thereby consecutively surface-treating with a large number of quantities without influencing to the deposition layer formed by the deposition reaction.

It will be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

The invention claimed is:

1. A surface treatment system comprising:
    a deposition chamber;
    one or more carriers for carrying an object of surface treatment by mounting thereon; and
    a power applying unit for forming a deposition layer at a surface of the object of surface treatment with a deposition reaction by applying a power to the object in the deposition chamber,
    wherein the power applying unit includes:
    a fixed power applying unit installed in the deposition chamber and connected to an external power source; and
    a movable power applying unit installed at a carrier which has a first electrical contacting member movably electrically connected to the fixed power applying unit and a discrete second electrical contacting member distinct from the carrier directly connected to the object of surface treatment, and located on the carrier on which the object of surface treatment is mounted in the deposition chamber, and
    wherein power is applied directly to the object of surface treatment mounted on the carrier by the movable power applying unit.

2. The system of claim 1, wherein the fixed power applying unit is insulatedly installed on a wall of the deposition chamber.

3. The system of claim 1, wherein the fixed power applying unit is installed at an upper side or a lower side of the deposition chamber.

4. The system of claim 1, wherein the fixed power applying unit includes a power applying line entering the deposition chamber connected with an external power source.

5. The system of claim 1, wherein the carrier is provided with a location fixing means for fixing a location of the object of surface treatment.

6. The system of claim 5, wherein the location fixing means includes a hooking portion formed at the second electrical contacting member so that the object of surface treatment can be hooked.

7. The system of claim 6, wherein the location fixing means additionally includes a corresponding hooking portion formed at the object of surface treatment so that the object of surface treatment can be hooked at the hooking portion.

8. The system of claim 7, wherein the carrier additionally includes an insulation supporting member for supporting the object of surface treatment hooked at the hooking portion with an electrically insulated state.

9. The system of claim 6, wherein the carrier additionally includes an insulation supporting member for supporting the object of surface treatment hooked at the hooking portion with an electrically insulated state.

10. The system of claim 6, wherein the second electrical contacting member is a mounting member in the form of a fixed bar electrically connected with the first electrical contacting member by a power connecting line.

11. The system of claim 10, wherein the location fixing means includes an annular groove formed at one side of the fixed bar, and a slidable stopper installed with a predetermined interval from the groove along the longitudinal direction of the fixed bar as a width of the corresponding hooking portion of the object of surface treatment.

12. The system of claim 1, wherein the power applying unit additionally includes a shielding member including insulating material for preventing the power applying unit from influencing on a deposition reaction and installed in the deposition chamber for shielding a contact portion between the fixed power applying unit and the movable power applying unit.

13. The system of claim 1, wherein the power applying unit further includes a shielding member including insulating material for preventing the power applying unit from influencing on a deposition reaction and installed in the deposition chamber for shielding the fixed power applying unit.

14. The system of claim 1, wherein the movable power applying unit further comprises a sliding contact means for electrically connecting the fixed power applying unit and the object of surface treatment mounted on the carrier movably at the time of a deposition reaction.

15. The system of claim 1, wherein the second electrical contacting member is in direct physical contact with and physically supporting the object of surface treatment.

* * * * *